United States Patent [19]

Parikh

[11] Patent Number: 6,127,263
[45] Date of Patent: Oct. 3, 2000

US006127263A

[54] MISALIGNMENT TOLERANT TECHNIQUES FOR DUAL DAMASCENE FABRICATION

[75] Inventor: Suketu A. Parikh, Santa Clara, Calif.

[73] Assignee: Applied Materials, Inc., Santa Clara, Calif.

[21] Appl. No.: 09/113,578

[22] Filed: Jul. 10, 1998

[51] Int. Cl.⁷ .............................................. H01L 21/4763
[52] U.S. Cl. ........................... 438/637; 438/618; 438/622
[58] Field of Search ..................................... 428/618, 622, 428/637

[56] References Cited

U.S. PATENT DOCUMENTS

| | | | |
|---|---|---|---|
| 5,354,711 | 10/1994 | Heitzmann et al. | 437/182 |
| 5,439,780 | 8/1995 | Joshi et al. | 430/296 |
| 5,592,024 | 1/1997 | Aoyama et al. | 257/751 |
| 5,614,765 | 3/1997 | Avanzino et al. | 257/774 |
| 5,635,423 | 6/1997 | Huang et al. | 437/195 |
| 5,651,855 | 7/1997 | Dennison et al. | 156/636 |
| 5,691,238 | 11/1997 | Avanzino et al. | 437/195 |
| 5,705,430 | 1/1998 | Avanzino et al. | 437/195 |
| 5,726,100 | 3/1998 | Givens | 438/702 |
| 5,739,579 | 4/1998 | Chiang et al. | 257/635 |
| 5,741,626 | 4/1998 | Jain et al. | 430/314 |
| 5,759,911 | 6/1998 | Cronin | 438/622 |
| 5,897,369 | 4/1999 | Jun | 438/629 |

FOREIGN PATENT DOCUMENTS

| | | | |
|---|---|---|---|
| 0680085 | 2/1995 | European Pat. Off. | H01L 21/768 |
| 0851483 | 7/1998 | European Pat. Off. | H01L 21/768 |
| 0911697A | 4/1999 | European Pat. Off. | G03F 1/00 |

OTHER PUBLICATIONS

Kaanta et al., "Dual Damascene: A ULSI Wiring Technology", VMIC Conference, IEEE, pp. 144–152, Jun. 11–12, 1991.

U.S. application No. 09/017,350 filed Feb. 2, 1998 to Mehul B. Naik.

Primary Examiner—Charles Bowers
Assistant Examiner—Nema Berezny
Attorney, Agent, or Firm—Albert J. Dalhuisen

[57] ABSTRACT

The present invention provides integrated circuit fabrication methods and devices wherein dual damascene structures are formed which compensate for misalignment between the via pattern and the trench pattern by widening the trench at the point where the misalignment has occurred. Methods and devices are also provided wherein the trench width is not affected by misalignment thus preventing electrical shorts between closely spaced interconnect lines, this technique results in a reduction of the width of the via. These dual damascene structures utilize two dielectric layers (210 and 216) having similar etching characteristics. Additionally, a hard mask layer (218) and an etch stop layer (214) having similar etching characteristics are used in these structures such that the etching characteristics of the dielectric layers are dissimilar to the etching characteristics of the hard mask and the etch stop layer. A trench (224) is formed in the hard mask layer (218). A photoresist (226) having a via pattern (228) is deposited on the hard mask layer (218) such that the via pattern (228) overlays the trench (224). The via pattern is anisotropically etched through any hard mask layer portion (230) which protrudes inside via pattern (228). This inventive technique results in widening the trench (222) while maintaining the original diameter of the via, even when the via and trench patterns are misaligned. In another embodiment the technique results in a trench (330) which is not widened, thus preventing electrical shorts which can result from misalignment between a via pattern (322) and a trench pattern (326). Etching degradation of etch stop and photoresist layers is reduced because the trench and the via hole are formed simultaneously. Further embodiments of the present invention include the use of single layer masks, such as silicon-based photosensitive materials (418) which form a hard mask upon exposure to radiation. In additional embodiments, manufacturing systems (610) are provided for fabricating IC structures. These systems include a controller (600) which is adapted for interacting with a plurality of fabrication stations (620, 622, 624, 626, 628, 630 and 632).

40 Claims, 11 Drawing Sheets

MISALIGNMENT TOLERANT TECHNIQUES FOR DUAL DAMASCENE FABRICATION

TECHNICAL FIELD

The present invention relates to the fabrication of semiconductor device interconnect lines and via plugs which are fabricated using dual damascene techniques.

BACKGROUND ART

A semiconductor device such as an IC (integrated circuit) generally has electronic circuit elements such as transistors, diodes and resistors fabricated integrally on a single body of semiconductor material. The various circuit elements are connected through conductive connectors to form a complete circuit which can contain millions of individual circuit elements. Advances in semiconductor materials and processing techniques have resulted in reducing the overall size of the IC while increasing the number of circuit elements. Additional miniaturization is highly desirable for improved IC performance and cost reduction. Interconnects provide the electrical connections between the various electronic elements of an IC and they form the connections between these elements and the device's external contact elements, such as pins, for connecting the IC to other circuits. Typically, interconnect lines form the horizontal connections between the electronic circuit elements while conductive via plugs form the vertical connections between the electronic circuit elements, resulting in layered connections.

A variety of techniques are employed to create interconnect lines and vias. One such technique involves a process generally referred to as dual damascene, which includes forming a trench and an underlying via hole. The trench and the via hole are simultaneous filled with a conductor material, for example a metal, thus simultaneously forming an interconnect line and an underlying via plug. Examples of conventional dual damascene fabrication techniques are disclosed in Kaanta et al., "Dual Damascene: A ULSI Wiring Technology", Jun. 11–12, 1991, VMIC Conference, IEEE, pages 144–152 and in U.S. Pat. No. 5,635,423 to Huang et al., 1997.

Figure 1A:
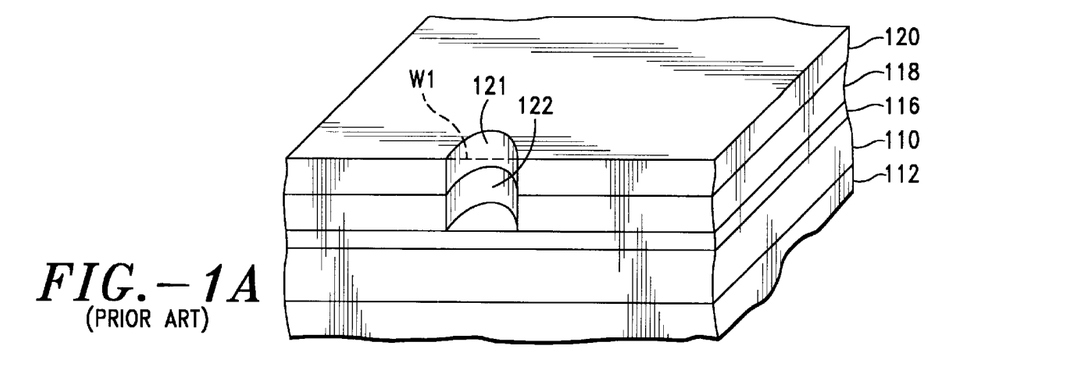
FIGS. 1A–1D are schematic cross-sectional perspective views illustrating prior art IC structures at sequential stages.
Figure 1B:
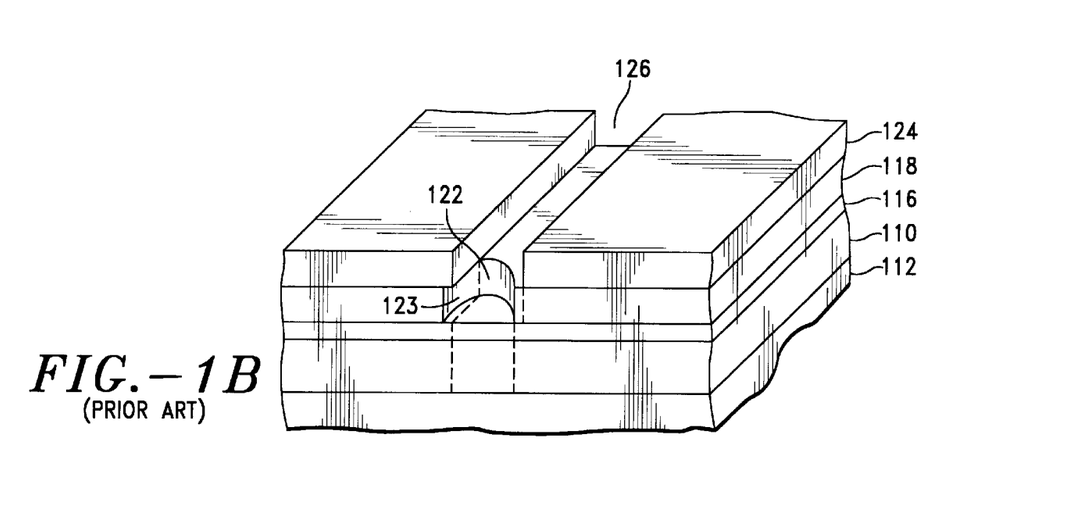

The prior art techniques, such as those disclosed in the above referenced publications, rely on forming the trench and the via hole for the dual damascene structure in the same etching step shown in FIGS. 1A–1D. As depicted in FIG. 1A, a first dielectric layer 110 is deposited on a semiconductor substrate 112. An etch stop layer 116, such as silicon nitride, is deposited on first dielectric layer 110. A second dielectric layer 118 is deposited on etch stop 116, and an etch mask 120 is positioned on dielectric layer 118. Etch mask 120 is patterned (121) for etching a via hole, having a width W1. Second dielectric layer 118 is etched using a first anisotropic etch procedure to form a hole 122 (FIG. 1A) conforming to the via pattern. This etching procedure is stopped at etch stop layer 116. Etch mask 120 is removed and another etch mask 124 (see, FIG. 1B) is positioned on second dielectric layer 118 such that it is patterned (126) for forming a trench which is intended to include the previously formed hole 122 conforming to the via pattern. However, when the trench pattern is misaligned with hole 122 (see, FIG. 1B), portion 123 of hole 122 is covered by mask 124. As shown in phantom, a second anisotropic etch procedure is used to etch the trench pattern through second dielectric layer 118. Simultaneously, hole 122 is extended to substrate 112, by etching through etch stop layer 116 and through first dielectric layer 110. In this dual damascene technique the first etch procedure has a greater selectivity to etch stop layer 116 than the second etch procedure.

Figure 1C:
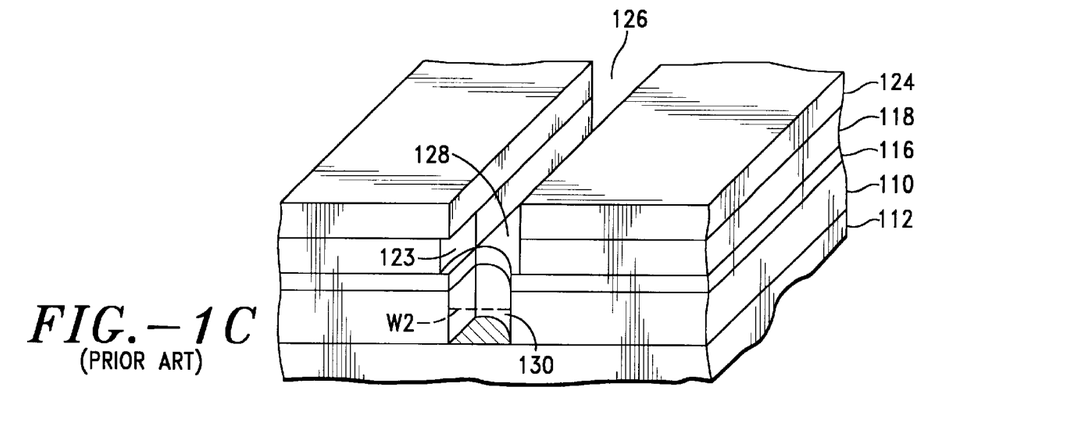
Figure 1D:
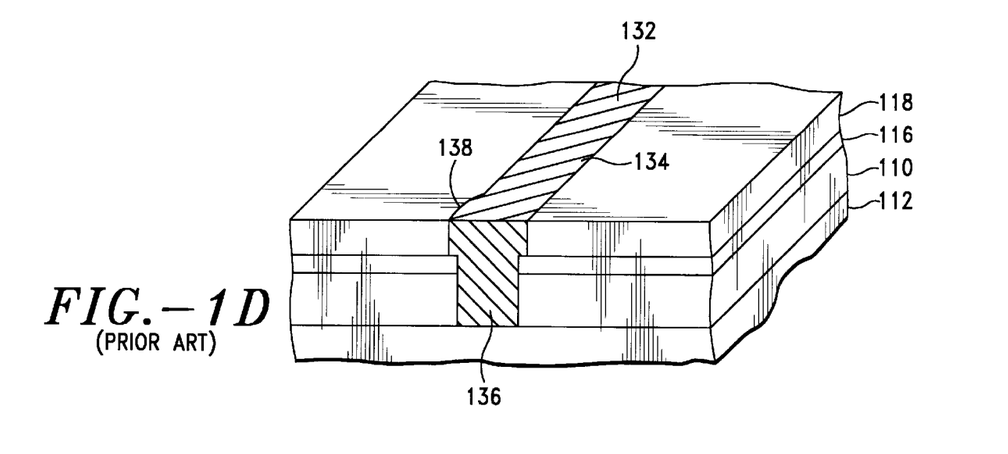

As shown in FIG. 1C, the second etch procedure results in forming trench 128 and via hole 130 which extends to semiconductor substrate 112. It will be noted that portion 123 of trench 128 is a widened portion of the trench due to the misalignment between via pattern 121 and trench pattern 126. However the widened portion 123 is not contiguous with underlying via hole 130, thereby reducing via pattern width W1 (FIG. 1A) to via hole width W2 (FIG. 1C). In other words, the width of the via hole is smaller than the width of the via pattern as a result of the misalignment. This prior art technique has other shortcomings as well, e.g. undeveloped resist (not shown) remaining on the bottom of hole 122, thereby impeding the complete etching of hole 130, and attack on the etch stop during via etch. Also, this procedure requires an etch chemistry which is very selective with respect to photoresist materials, which is difficult to achieve with dielectrics such as those having a low dielectric constant.

Mask 124 is removed, after which trench 128 and via hole 130 are simultaneously filled with a suitable conductive metal 132 (see, FIG. 1D) forming metallized line 134 and via plug 136 which contacts substrate 112. Excess metal 132 is removed from the surface of layer 118, for example by planarizing, to define line 134. Dual damascene line 134 has a widened section 138 resulting from the via misalignment, but this widened section is not contiguous with via plug 136, thus resulting in a reduced plug width as compared with the width of the via pattern.

Prior art techniques for forming via holes and trenches suitable for dual damascene fabrication result in a reduced via width when the trench pattern and the via pattern are misaligned, as described above in connection with FIGS. 1A–1D, particularly when the trench pattern width is substantially the same as the via pattern width. A significant reduction in via width makes it more difficult to fill the via hole with conductive metal, particularly when the via hole has a relatively high aspect ratio. Filling difficulties can result in filling the via incompletely, causing electrical or mechanical failure of the dual damascene structure. Also, a reduced width of the via results in a reduced contact area between the interconnect line and the underlying via plug, which can cause a highly disadvantageous increase in the contact resistance between the line and the via plug. Also, the prior art techniques described in connection with FIGS. 1A–1D result in widening the line at the misalignment point. Widening a line can result in an electrical short between closely spaced adjacent lines.

Accordingly, the need exists for improved methods for dual damascene fabrication to compensate for misalignment between the via mask and the trench mask and to overcome fabrication problems resulting from the presence of undeveloped resist impeding the complete formation of via holes as well as the need for etch chemistry which is very selective with respect to photoresist and etch stop layers.

DISCLOSURE OF INVENTION

The present invention provides novel methods and structures for dual damascene integrated circuit devices which overcome the prior art shortcomings described above.

In one embodiment of the present invention a first dielectric layer is deposited on a substrate, such as a semiconductor substrate. This is followed by the deposition of an etch stop layer upon which a second dielectric layer is deposited. The first and second dielectric layers have similar etching characteristics, i.e. the etching properties of these layers are such that the layers are capable of being etched at similar etching rates in a particular etch chemistry. A hard mask layer is deposited on the second dielectric layer. This hard mask has similar etching characteristics as the etch stop layer. A photoresist having a trench pattern is deposited on the hard mask layer. The trench pattern is transferred to the hard mask, after which this resist is stripped. A photoresist is then deposited on the hard mask, and a via pattern is developed in the photoresist over the underlying trench pattern in the hard mask. The via pattern is anisotropically etched through any portions of the hard mask which protrude into the via pattern due to a misalignment between the via pattern and the trench pattern. The via pattern is then anisotropically etched through the second dielectric layer and through the etch stop layer. After removal of the resist, a subsequent anisotropic procedure is used to simultaneously transfer the trench pattern through the second dielectric layer and to transfer the via pattern through the first dielectric layer. A further anisotropic etching procedure is used to simultaneously etch the trench pattern through the etch stop layer and to remove the hard mask layer, thus forming a via hole and a trench. This novel technique results in the formation of a misalignment compensating portion which is contiguous with the trench and the via hole such that there is no reduction in the width of the via hole when the via mask and the trench mask are misaligned. A dual damascene structure is fabricated by simultaneously filling the via hole and the trench with a conductive material such as a metal. This structure includes a misalignment compensating segment which is contiguous with the dual damascene line and the corresponding via plug, such that the width of the via plug is not reduced when the via mask and the trench mask are misaligned. The misalignment compensating feature of this embodiment causes the trench and the line to be widened at the misalignment compensating segment.

In an alternate embodiment of the above described invention, an additional hard mask layer such as a nitride is deposited on the above described hard mask layer when the latter mask comprises an oxide which is deposited on a second dielectric layer comprising a material having a low (<3.5) dielectric constant. A photoresist having a trench pattern is provided on the nitride mask. The mask pattern is transferred to the nitride mask after which the resist is stripped. The trench mask is then transferred to the oxide mask, and the nitride mask is removed. The techniques of the present invention are then utilized as described above in order to fabricate the dual damascene structures. This alternate embodiment is particularly advantageous when the processing techniques for stripping resist affect the second dielectric layer.

In another embodiment of the present invention a first dielectric layer is deposited on a substrate, such as a semiconductor substrate, followed by the deposition of an etch stop layer. A second dielectric layer is deposited on the etch stop layer. The first and second dielectric layers have similar etching characteristics. A hard mask layer having similar etching characteristics as the etch stop layer is deposited on the second dielectric layer. A photoresist having a via pattern is provided on the hard mask layer. This via pattern is transferred to the hard mask layer after which the photoresist is removed. A photoresist is then deposited on the hard mask layer and a trench pattern is developed in this photoresist over the underlying via pattern. The via pattern which is located in the photoresist trench pattern is anisotropically etched through the second dielectric layer. An additional anisotropic etching procedure is used to etch the trench pattern through the hard mask layer and to simultaneously etch the via pattern through the etch stop layer. The trench pattern and the via pattern are then anisotropically simultaneously etched through the second and first dielectric layers respectively. The photoresist and the hard mask are removed, resulting in the formation of a trench and a via hole. The trench width of this embodiment conforms to the trench pattern even when the via pattern and the mask pattern are misaligned. However, misalignment causes a reduction in the via width when the trench pattern width and the via pattern width are similar. A dual damascene structure is formed by simultaneously filling the via hole and the trench with a suitable conductive material, such as a metal, wherein misalignment causes a reduction in the width of the via plug because the via width is determined by the width of the trench mask. Misalignment does not cause the line to be widened thus eliminating the problem of electrical shorts between closely spaced interconnect lines.

In yet another embodiment of the present invention, single layer etch masks are utilized wherein a silicon-based photosensitive material forms a hard mask upon exposure to radiation. Suitable examples of these mask materials include plasma polymerized methylsilane which is converted to plasma polymerized methylsilane oxide when exposed to UV light, thus forming a hard mask. These masks are utilized in combination with the above described embodiments of the invention.

In additional embodiments of the present invention, manufacturing systems are provided for forming fabricated structures, such as the IC structures of the present invention. These systems include a controller, such as a computer, which is adapted for interacting with a plurality of fabrication stations. Each of these fabrication stations performs a processing step which is utilized to fabricate the IC structures. Operative links provide connections between the controller and the manufacturing stations. A data structure, such as a computer program, causes the controller to control the processing steps which are performed at the fabrication stations. Preferably, the data structure is provided on a removable electronic storage medium.

The embodiments of the present invention result in reduced etching degradation of etch stop and photoresist layers because the trench and the via hole are formed simultaneously.

BRIEF DESCRIPTION OF DRAWINGS

The details of the invention will be described in connection with accompanying drawings.

BEST MODE FOR CARRYING OUT THE INVENTION

While describing the invention and its embodiments, certain terminology will be utilized for the sake of clarity. It is intended that such terminology include not only the recited embodiments but all equivalents which perform substantially the same function, in substantially the same manner to achieve the same result.

Figure 2A:
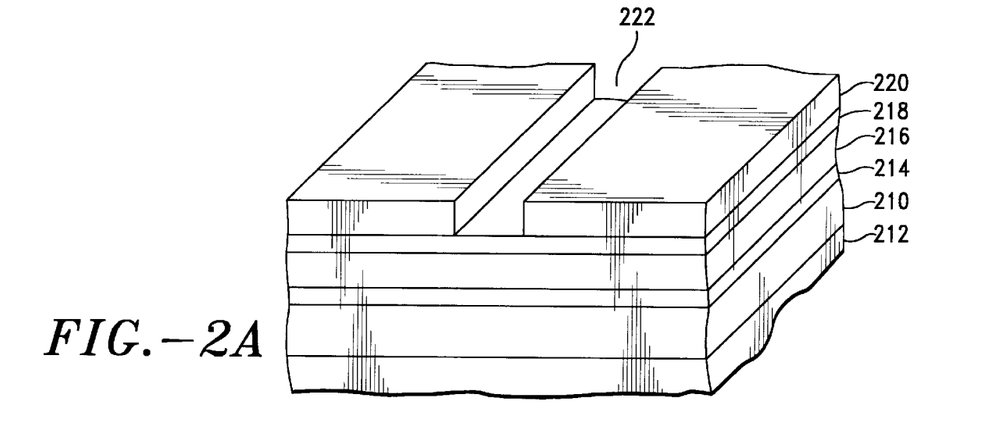
FIGS. 2A–2I are schematic cross-sectional perspective views illustrating an embodiment of IC structures of the present invention at sequential stages.

In one embodiment of the invention, a novel dual damascene process is employed wherein a via is formed which is substantially equal to design rule, even if there is misalignment between the via pattern and the trench pattern, as illustrated in the fabricated structures, such as IC structures shown in FIGS. 2A–2I, wherein the expression "integrated circuit structure" as defined herein, includes completely formed integrated circuits and partially formed integrated circuits. FIG. 2A depicts a first dielectric layer 210 which is deposited on a substrate, such as semiconductor substrate, 212. The expression "semiconductor substrate" as defined herein, includes structures and devices comprising typical integrated circuit elements, components, interconnects and semiconductor materials.

An etch stop layer 214 is deposited on layer 210. This is followed by the deposition of a second dielectric layer 216, upon which is deposited a hard mask layer 218. Photoresist 220 is deposited on hard mask layer 218. These dielectric, etch stop and mask layers can be deposited by any of the methods which are well known to those of ordinary skill in the art.

The present invention's first and second dielectric layers 210 and 216 respectively, have similar etching characteristics. The expression "similar etching characteristics" of two or more materials as defined herein, includes etching properties of these materials such that the materials are capable of being etched at similar etching rates in a particular etch chemistry. Hard mask layer 218 and etch stop layer 214 have similar etching characteristics while second dielectric layer 216 and etch stop layer 214 have dissimilar etching characteristics. The expression "dissimilar etching characteristics" of two materials as defined herein, includes etching properties of these materials such that one of the materials has a higher etch rate than the other material in a specific etch chemistry.

Figure 2B:
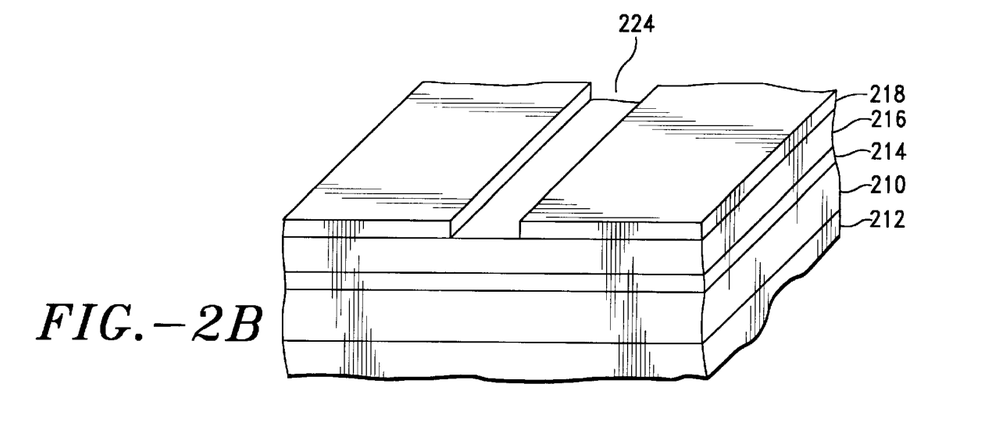
Figure 2C:
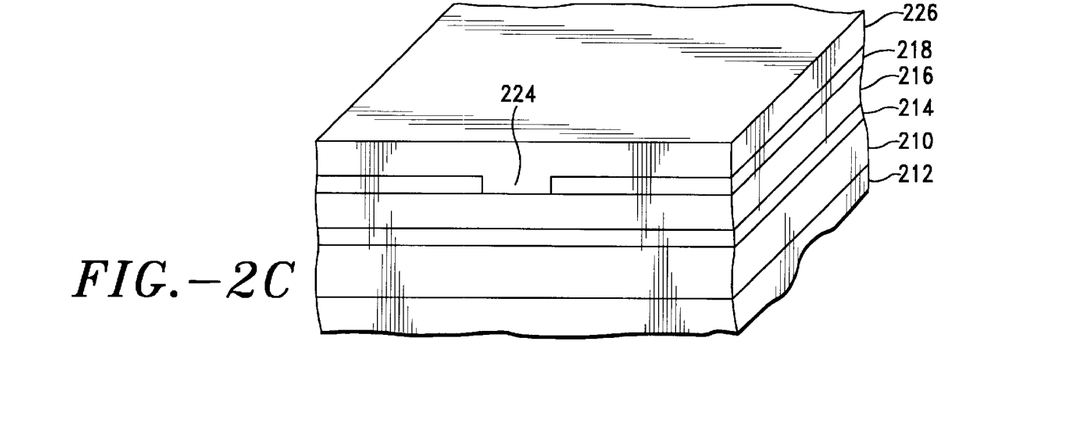
Figure 2D:
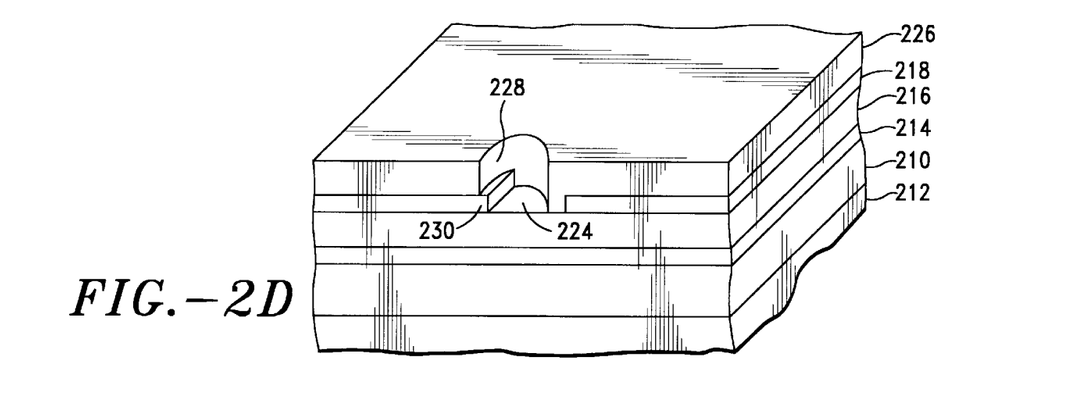
Figure 2E:
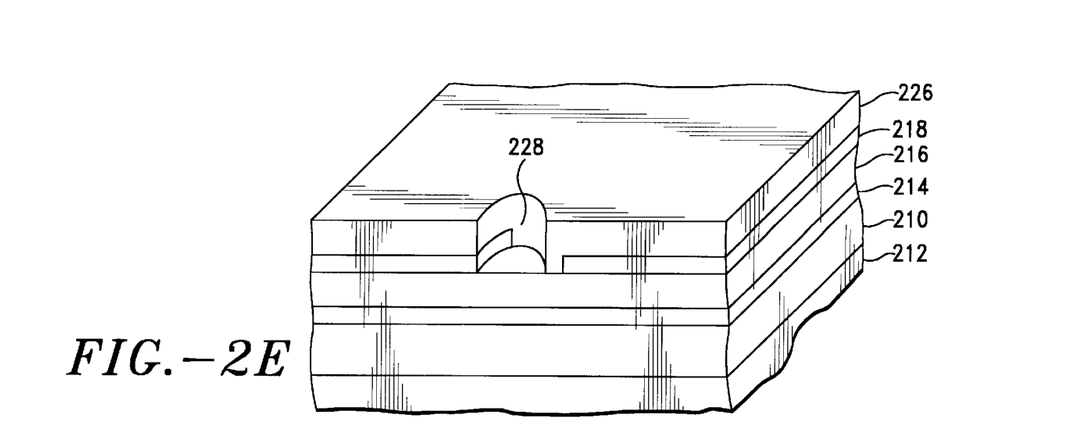
Figure 2F:
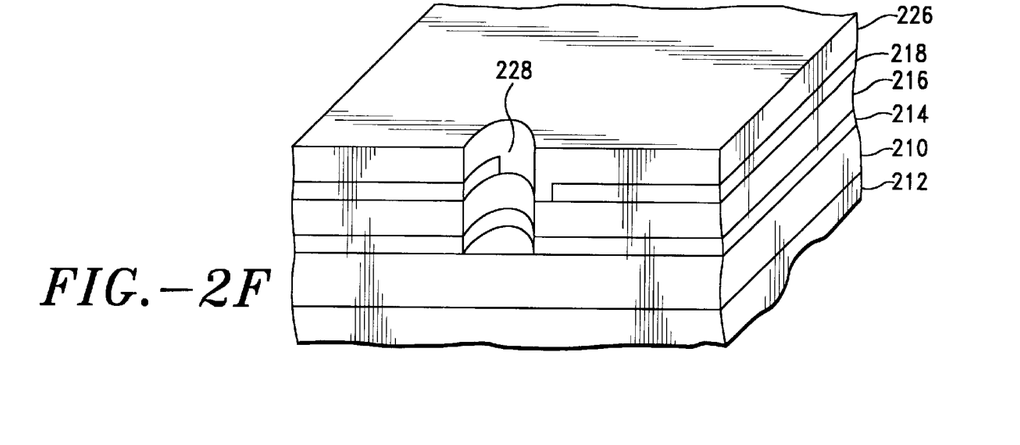
Figure 2G:
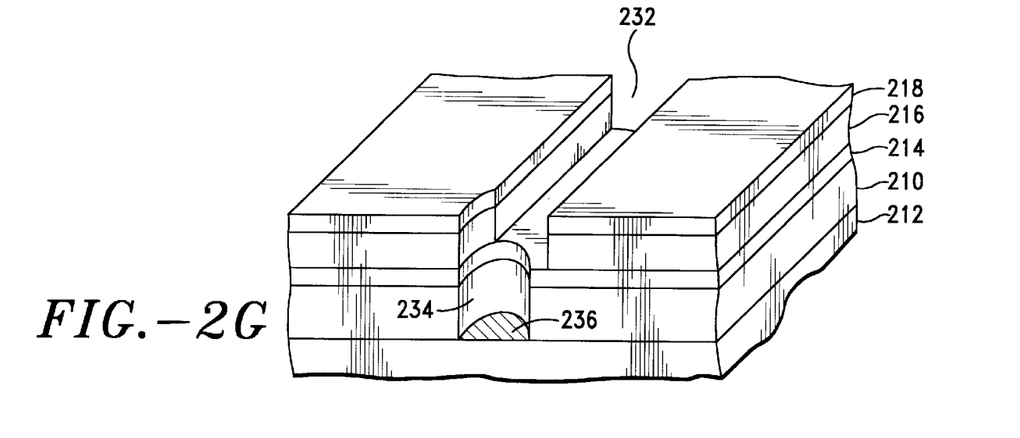

Photoresist 220 is patterned for a trench 222 which is transferred to hard mask layer 218, thereby forming hard mask trench pattern 224, see FIG. 2B, after which photoresist 220 is removed. As illustrated in FIG. 2C, photoresist 226 is positioned on hard mask 218, partly or completely filling hard mask trench pattern 224. A via pattern 228 (FIG. 2D) is provided in photoresist 226 such that the via pattern is positioned over the underlying trench pattern. FIGS. 2D–2I illustrate inventive structures wherein the diameter of the via pattern is substantially equal to the width of the trench pattern. In alternate embodiments (not shown) the width of the via pattern can be different from the width of the trench pattern. As shown in FIG. 2D, via pattern 228 is misaligned with trench pattern 224. As a consequence of this misalignment, a portion 230 of hard mask 218 protrudes inside via pattern 228. Hard mask portion 230 is removed by a first selective anisotropic etching procedure such that the etching process is selective with respect to second dielectric layer 216 and with respect to photoresist 226. Selective etching of portion 230 results in a transfer of via pattern 228 through hard mask 218, as is shown in FIG. 2E. Where two materials are exposed to a particular etching process, the etching process is defined herein as being selective with respect to one of the materials when this material is etched at a significantly slower rate than the other material. It will be noted that hard mask layer 218 does not protrude into via pattern 228 when the via pattern and the trench pattern are in good alignment with each other. A second anisotropic etching procedure is utilized to selectively etch the via pattern through second dielectric layer 216, as depicted in FIG. 2F. This is followed by transferring the via pattern through etch stop layer 214 using a third anisotropic etching procedure, thus extending the via pattern to the top surface of first dielectric layer 210, see FIG. 2F. Photoresist 226 is removed, as shown in FIG. 2G. Alternately, photoresist 226 is removed at a later processing step, i.e. after completing the fourth etching procedure in order to protect hard mask 218, or during the fourth etching procedure particularly where the resist and second dielectric layer use the same etch chemistry.

Figure 2H:
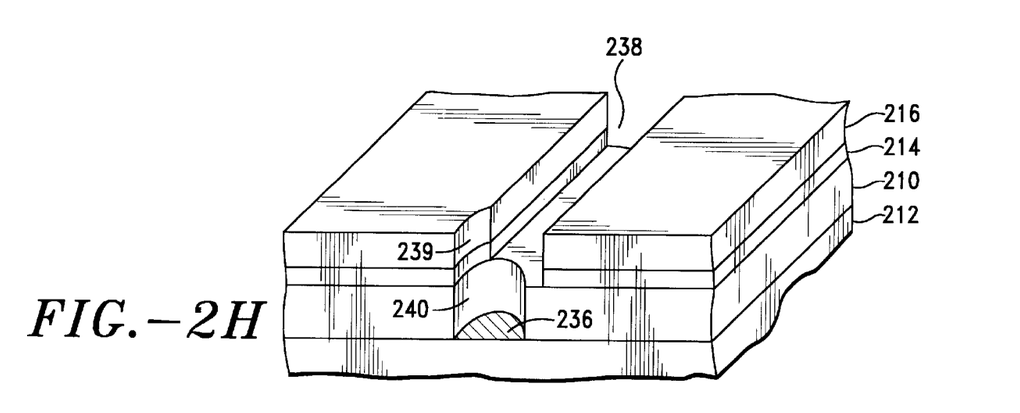
Figure 2I:
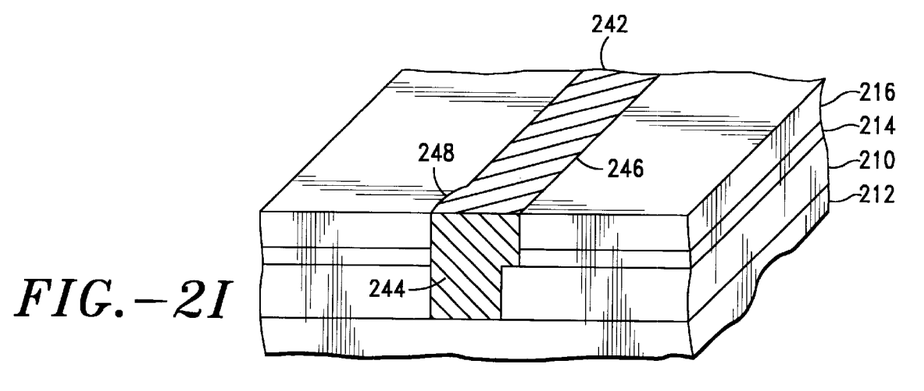

A fourth anisotropic etching procedure is employed to anisotropically etch trench pattern 232 (FIG. 2G) through second dielectric layer 216, wherein hard mask 218 is the etch mask. Etch stop layer 214 provides the etch stop for etching trench pattern 232. As shown in FIG. 2H, the fourth etching procedure also etches the via pattern through first dielectric layer 210, transferring the via pattern to surface 236 of semiconductor substrate 212 thereby forming hole 234. Trench pattern 232 and the via pattern are etched simultaneously, by utilizing the first and second layers' similar etching characteristics. A fifth anisotropic etching procedure is used to remove hard mask 218 and to etch the trench pattern through etch stop 214, thereby forming trench 238 (FIG. 2H) and via hole 240. In an alternate embodiment (not shown) a passivation or cap layer is interposed between semiconductor substrate 212 and first dielectric layer 210. The via pattern is transferred through this cap layer during the fifth anisotropic etching procedure, simultaneously removing hard mask 218 and etching the trench pattern through etch stop layer 214. As illustrated in FIG. 2I, via hole 240 and trench 238 are simultaneously filled with a conductive material, such as a metal 242, forming a dual damascene structure comprising via plug 244 and metallized line 246. Excess conductive material 242 is removed from the surface of layer 216, for example using CMP (chemical-mechanical polishing), or using Cu metal etch back, to define line 246. The expression "dual damascene structure" as defined herein, includes an interconnect line and an underlying via plug which are formed simultaneously, wherein the interconnect line is formed in a trench.

It will be noted that the present invention as described in connection with FIGS. 2A–2I, compensates for misalignment between a via pattern and a trench pattern by widening the trench to accommodate the complete via pattern. As shown in FIG. 2H, trench 238 has a widened portion 239 which is contiguous with the underlying via hole 240. Prior art techniques however, do not have a widened portion which is contiguous with the underlying via hole, as described in connection with FIG. 1C. The present invention thus compensates for misalignment offset by using techniques wherein the trench is widened by a misalignment compensating portion which equals the misalignment offset, and continuing the compensating portion into the underlying via hole, such that the widened portion is contiguous with the trench and the via hole. The expression "misalignment offset" as defined herein includes the extent to which a trench pattern and corresponding dual damascene via pattern are misaligned. Line 246 includes a misalignment compensating segment 248 (FIG. 1I) which is continued in underlying via plug 244 such that the segment is contiguous with the line and the via plug. This overcomes the prior art shortcoming of reducing the via width when the via and trench are misaligned.

Additionally, the present method minimizes etch stop layer degradation because the trench and via hole are etched simultaneously. The simultaneous etching preserves the configuration of the via pattern in etch stop layer 214 thus allowing the use of a thinner etch stop layer, while still forming a well defined via hole. The method provides a further advantage as compared with prior art techniques wherein the via hole is formed before the trench is created. It has been found that these prior art techniques make it difficult to remove photoresist from the via hole, particularly if the via hole has a high aspect ratio. The present inventive technique forms the trench simultaneously with the via hole, thus preventing prior art problems which are associated with the difficulty of removing resist from the via hole.

The above embodiments of the present invention utilize a series of anisotropic etching procedures requiring selective etching. For example, the etch chemistry for the second etching procedure must be such that it is highly selective with respect to etch stop 214. The third etching procedure requires an etch chemistry which is highly selective with respect to the first dielectric layer, while the fourth etching procedure requires an etching procedure having high etch selectivity with respect to the hard mask and the etch stop layer. Etching procedures having high etch selectivity with respect to the first and second dielectric layers are needed in the fifth etching procedure. The etch selectivity requirements can be met by choosing the various materials for the stack as follows. One example of a suitable stack comprises oxide first and second dielectric layers, such as PECVD (plasma-enhanced chemical vapor deposition) $SiO_2$ and using nitride, such as CVD (chemical vapor deposition) silicon nitride, hard mask, etch stop layers and possibly cap layers. Another suitable stack comprises materials having a low dielectric constant in the first and second dielectric layers such as polymers (such as, amorphous fluorinated carbon based materials, fluorinated poly (arylene) ether, poly (arylene) ethers), spin coat and aero-gel, while using oxide such as $SiO_2$ in the hard mask and in the etch stop. Materials having a low dielectric constant as defined herein include materials having a dielectric constant <3.5.

It will be noted that the thickness of the first dielectric layer (the inter-metal layer) is similar to the height of the via plug, typically 1 $\mu$m or less. The combined thickness of the etch stop layer and the second dielectric layer (the intra-metal layer) is similar to the thickness of metal line, ranging from 0.2 to 4 $\mu$m, wherein 0.5 $\mu$m is a typical thickness.

As described in connection with FIGS. 2D and 2E, the portion of the hard mask which protrudes into the via pattern due to mask misalignment is removed through selective etching, resulting in widening the trench pattern in this region. A very extensive misalignment therefore causes a very extensive widening of the dual damascene line which can result in an electric short between the widened line and a line which is adjacent to it in the same intra-metal layer. If the protruding portion is not removed, there is no misalignment compensating effect in the line, causing the resulting via plug to have a reduced width. In that case, the misalignment is not compensated but the novel technique still provides the other very significant advantages as compared with prior art techniques. Specifically, the present invention does not have the problems associated with resist removal from the via hole and it allows for using a thinner etch layer than prior art IC structures, even if the protruding portion is not removed.

Another embodiment (not shown) of the present invention provides an additional hard mask layer which is interposed between hard mask layer 218 and photoresist 220 of IC structures such as those illustrated in FIGS. 2A–2I. In this embodiment, the additional hard mask comprises a nitride, while mask layer 218 comprises an oxide which is deposited on a second dielectric layer comprising a material having a dielectric constant <3.5. The trench pattern which is developed in the photoresist is transferred to the nitride mask. The resist is then stripped after which the trench pattern is transferred to the oxide mask after which the nitride hard mask is removed. The technique for fabricating dual damascene structures of the present invention is then continued as described in connection with FIGS. 2C–2I. A nitride mask is advantageously used in this embodiment to protect the second dielectric layer from the photoresist stripping process.

Figure 3A:
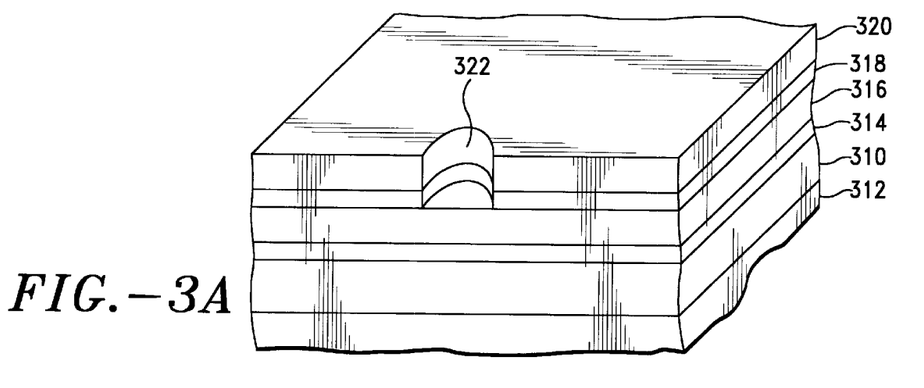
FIGS. 3A–3G are schematic cross-sectional perspective views illustrating another embodiment of IC structures of the present invention at sequential stages.
Figure 3B:
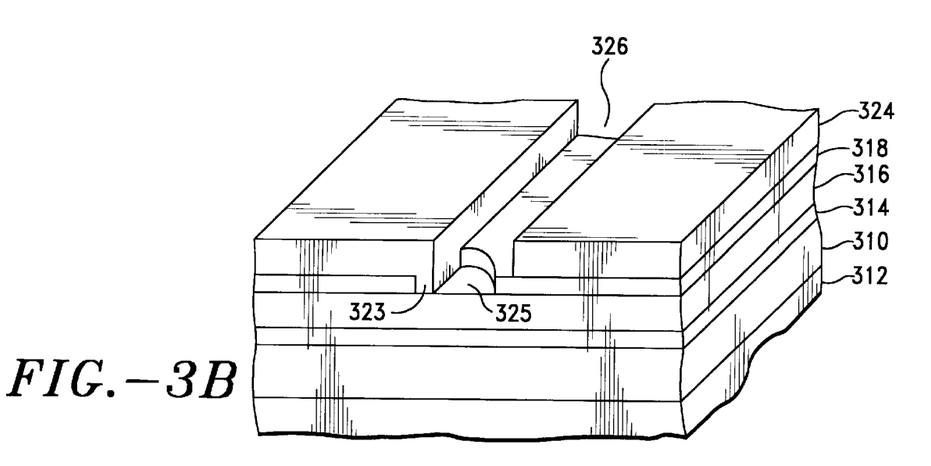

The fabricated structures, such as the IC structures shown in FIGS. 3A–3G illustrate another misalignment tolerant embodiment of the present dual damascene fabrication invention. FIG. 3A shows a first dielectric layer 310 which is deposited on a substrate, such as a semiconductor substrate, 312. Etch stop layer 314 is deposited on first dielectric layer 310. Second dielectric layer 316 is deposited on the etch stop layer, followed by the deposition of hard mask layer 318 and photoresist 320. The dielectric, etch stop and mask layers can be deposited by any of the methods which are well known to those of ordinary skill in the art. The first and second dielectric layers of this embodiment of the present invention illustrated in FIGS. 3A–3G have similar etching characteristics, while the second dielectric layer and the etch stop layer have dissimilar etching characteristics. The hard mask layer and the etch stop layer have similar etching characteristics. A via pattern 322 (FIG. 3A) is developed in photoresist 320 and then transferred through hard mask layer 318. Photoresist 320 is removed and replaced by a photoresist 324, as shown in FIG. 3B. A trench pattern 326 is developed in photoresist layer 324 such that the trench pattern is positioned over the underlying via pattern. FIG. 3B illustrates an example of misalignment between via pattern 322 and trench pattern 326. It is noted that portion 323 of photoresist 324 is deposited partly inside the via pattern as a result of the misalignment. This causes the width of the via pattern to be reduced to pattern 325.

Figure 3C:
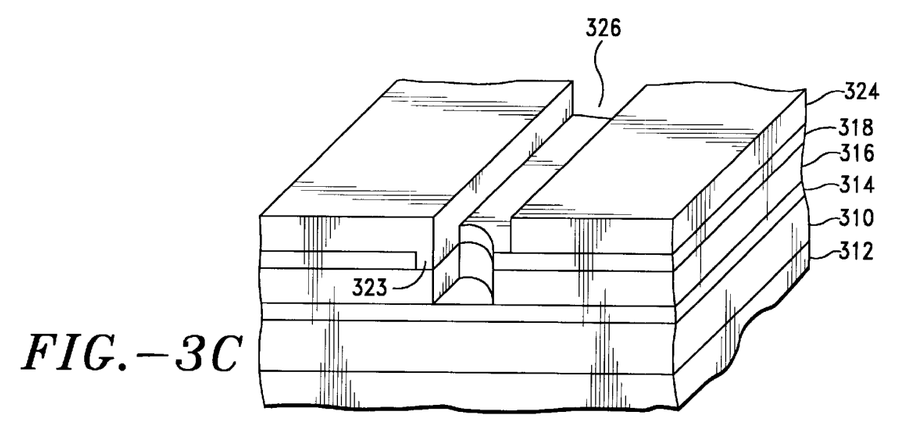
Figure 3D:
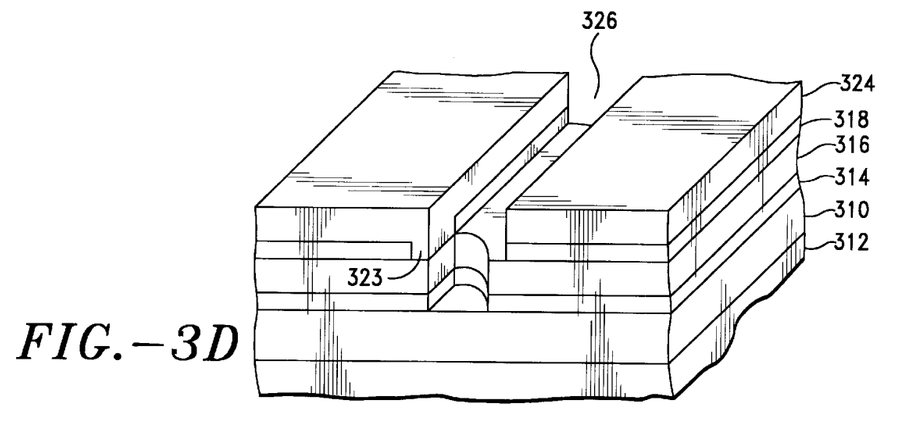
Figure 3E:
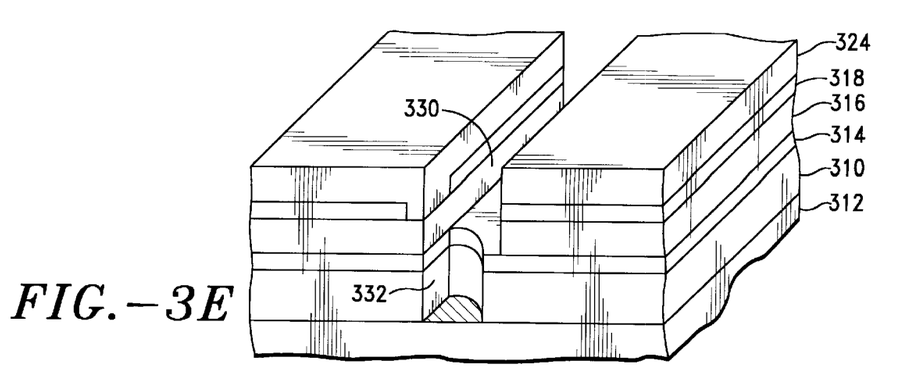

A first anisotropic etching procedure is used to selectively etch via pattern 325 through second dielectric layer 316, using etch stop layer 314 to stop the first etching procedure, see FIG. 3C. Subsequently, a second anisotropic etching procedure is used to transfer the trench pattern through hard mask layer 318 and simultaneously transfer the via pattern through etch stop layer 314, shown in FIG. 3D. First and second dielectric layers 310 and 316 are etch stops in the second anisotropic etch procedure. As depicted in FIG. 3E, a third anisotropic etching procedure is employed to etch trench pattern 326 through second dielectric layer 316, while simultaneously etching via pattern 328 through first dielectric layer 310, forming trench 330 in layer 316 and forming via hole 332 in layers 314 and 310. The etch chemistry of the third anisotropic etching procedure is selective with respect to etch stop layer 314 and semiconductor substrate 312. Layers 314 and 312 thus provide the etch stops. Finally, resist 324 and hard mask 318 are removed resulting in the structure shown in FIG. 3F. Via hole 332 extends to surface 334 of semiconductor substrate 312, such as for example the surface of a metallized line. A dual damascene structure is fabricated by simultaneously filling trench 330 and via hole 332 with a suitable conductive material 336, forming via plug 338 and interconnect line 340, as depicted in FIG. 3G. Suitable materials for the IC structures of this embodiment are similar to those for the embodiment described in connection with FIGS. 2A–2I.

Figure 3F:
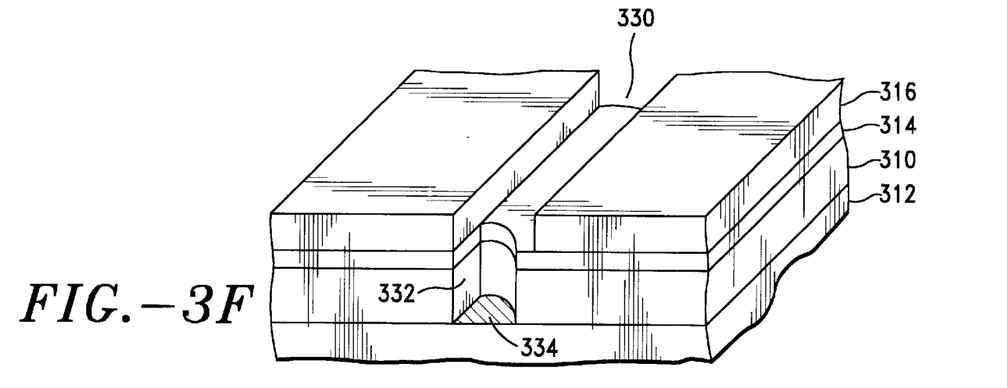
Figure 3G:
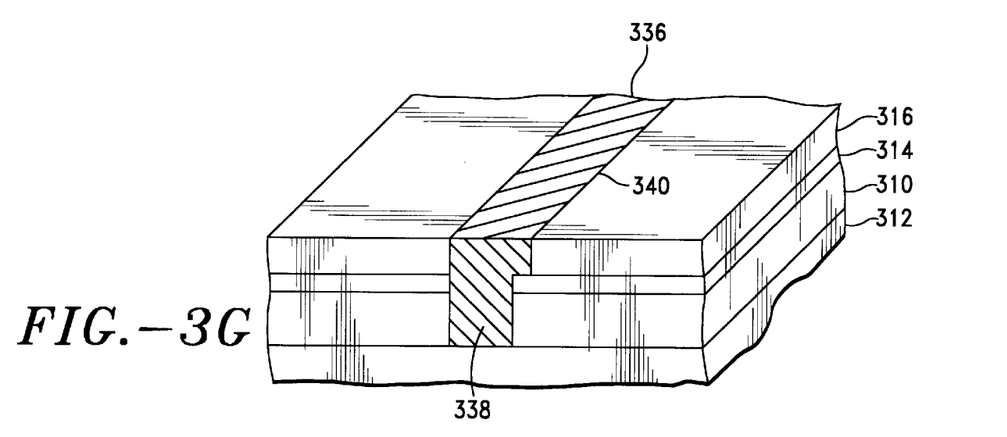

Additional embodiments (not shown) of the present invention include depositing a liner inside the via holes and trenches of the IC structures shown in FIGS. 2H and 3F. The lined via holes and trenches are then simultaneously filled with a conductive material to form dual damascene structures. Suitable liner materials include adhesion promoters and diffusion barrier materials. For example suitable liner materials for Cu or Cu alloy containing dual damascene structures of the present invention include CVD (chemical vapor deposition) or PVD (physical vapor deposition) TiN, WN, Ta and TaN. Examples of suitable liner materials for Al, Al alloy, W, or W alloy containing dual damascene structures include PVD Ti/TiN.

The novel technologies of the present invention, as illustrated in FIGS. 3A–3G, show that misalignment between a via pattern and a trench pattern causes a reduction in the width of the via hole and the via plug, similar to the reduction which is caused by prior art technologies, such as illustrated in FIGS. 1A–1D. However, unlike these prior art techniques and unlike the embodiments of the present invention illustrated in FIGS. 2A–2I, the embodiments shown in FIGS. 3A–3G do not result in widening the interconnect line at the misalignment point. It is particularly important to prevent widening of interconnect lines when these lines are positioned in close proximity to each other, in order to prevent an electrical short between adjacent lines.

Figure 4A:
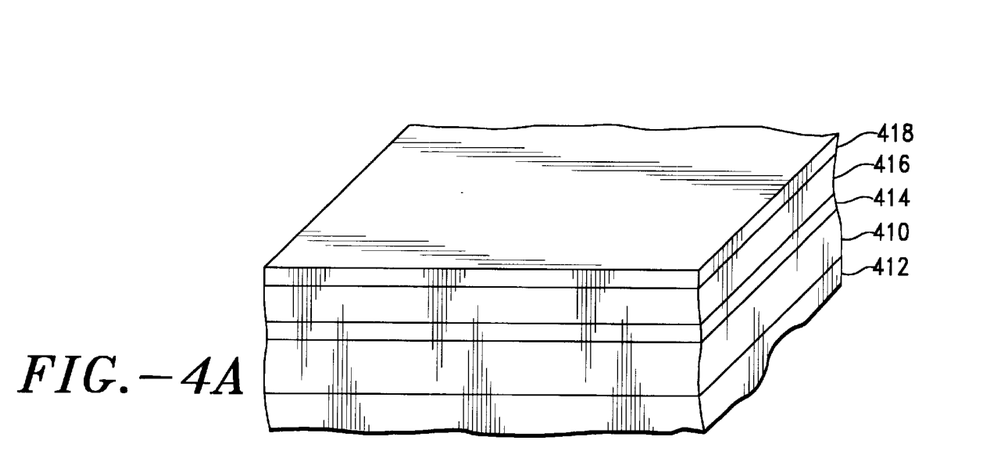
FIGS. 4A–4E are schematic cross-sectional perspective views illustrating another embodiment of IC structures of the present invention at sequential stages.
Figure 4B:
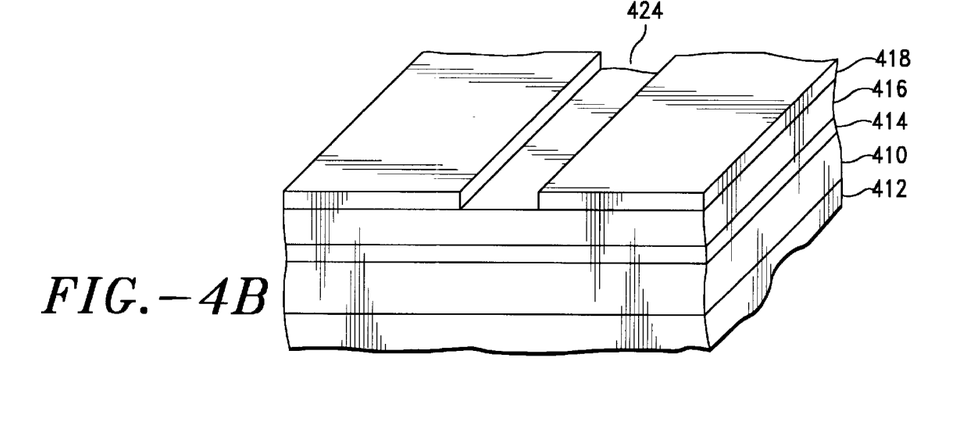
Figure 4C:
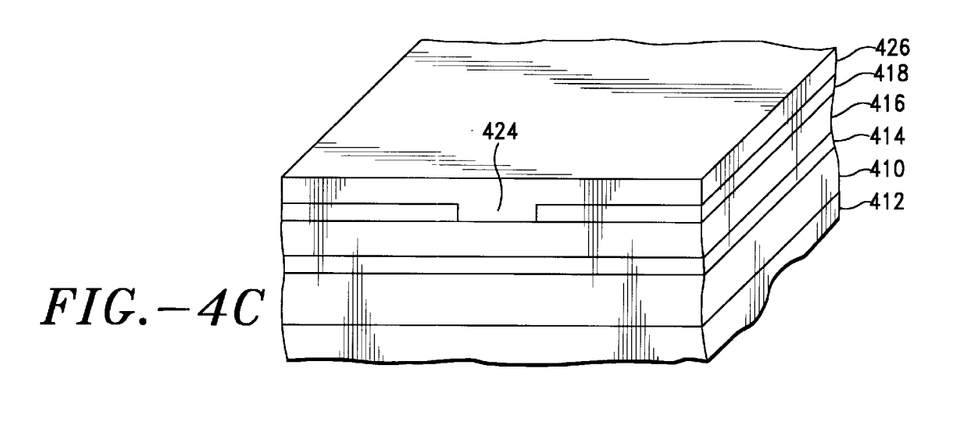

The novel techniques of the present invention are operable with combinations of photo and hard masks. Hard masks, such as $SiO_2$ or silicon nitride, are particularly preferred for $O_2$-based etch chemistry used in the selective etching of materials having a low dielectric constant, because photoresist has poor resistance to $O_2$-based etching. Conventional hard mask technology entails the use of a photoresist on a hard mask layer, thus using two mask layers. The photoresist is developed and the pattern is transferred to the hard mask layer. Advantageously, the present invention is well suited to hard mask preparation techniques using a single layer of silicon-based photosensitive material which is resistant to $O_2$-based etch chemistry, as is disclosed in commonly assigned U.S. patent application Ser. No. 09/017,350, filed: Feb. 2, 1998. An embodiment of the present invention utilizing the single layer hard mask technology is illustrated in the IC structures shown in FIGS. 4A–4E. FIG. 4A depicts an IC structure having a first dielectric layer 410 which is deposited on a substrate, such as a semiconductor substrate, 412. An etch stop layer 414 is deposited on layer 410. This is followed by the deposition of a second dielectric layer 416. Layers 410, 412, 414 and 416 shown in FIG. 4A are similar to layers 210, 212, 214 and 216 respectively, depicted in FIG. 2A.

A layer of silicon-based photosensitive mask material 418 is deposited on second dielectric layer 416, using for example a CVD process. Suitable materials for mask layer 418 include CVD PPMS (plasma polymerized methylsilane), such as shown in U.S. Pat. No. 5,439,780. The PPMS layer is patterned for a trench by selective exposure to UV light converting the exposed portion of the PPMS layer into PPMSO (plasma polymerized methylsilane oxide). The etch pattern in layer 418 is developed by removing the unexposed PPMS portion of the layer, resulting in a hard mask having trench pattern 424 (FIG. 4B) which conforms to the trench configuration of the dual damascene process. Unexposed PPMS is removed using for example a $Cl_2$ or $Cl_2$-HBr based plasma etch. This etch chemistry is particularly suitable for dual damascene technology involving materials having a low dielectric constant since these materials generally have an excellent resistance to this etch chemistry.

Figure 4D:
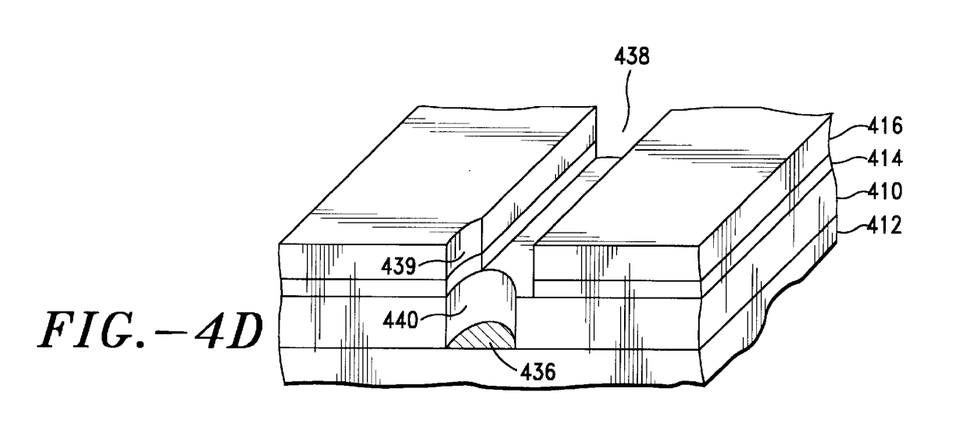
Figure 4E:
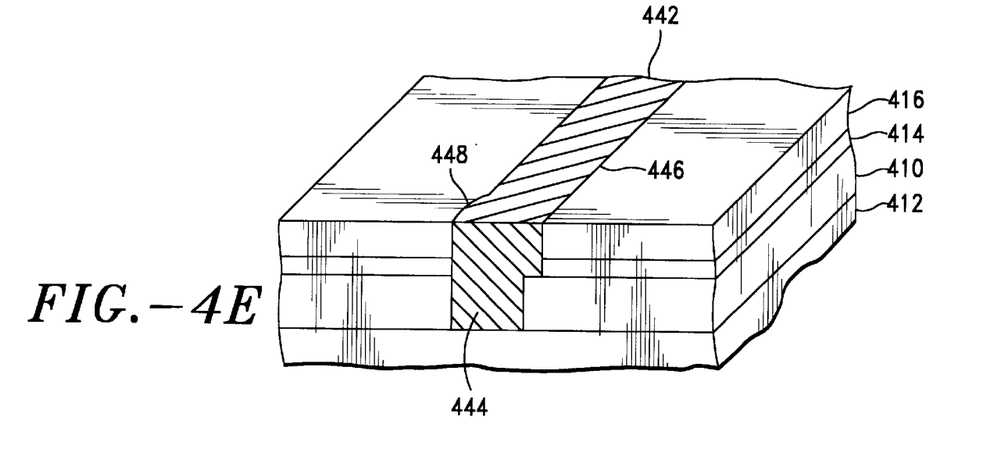

After the formation of trench pattern 424 in PPMSO layer 418, photoresist 426 is positioned on trench mask 424, partly or completely filling mask trench pattern 424, similar to photoresist 226 of FIG. 2C. The dual damascene fabrication process is then continued in a manner similar to the inventive processing steps described in connection with FIGS. 2D–2I, resulting in the IC structures depicted in FIGS. 4D and 4E. FIG. 4D shows trench 438 and via hole 440. Trench 438 includes a widened portion 439 which is contiguous with the underlying via hole 440 (similar to portion 239 shown in FIG. 2H). As depicted in FIG. 4E, via hole 440 and trench 438 are simultaneously filled with a conductive material, such as a metal 442, forming a dual damascene structure comprising via plug 444 and metallized line 446. The dual damascene structure shown in FIGS. 4D and 4E compensates for misalignment between a trench and a via in the same manner as the dual damascene structure of FIGS. 2H and 2I. However, the present embodiment advantageously uses a single layer of silicon-based photosensitive material, for forming a hard mask.

Figure 5A:
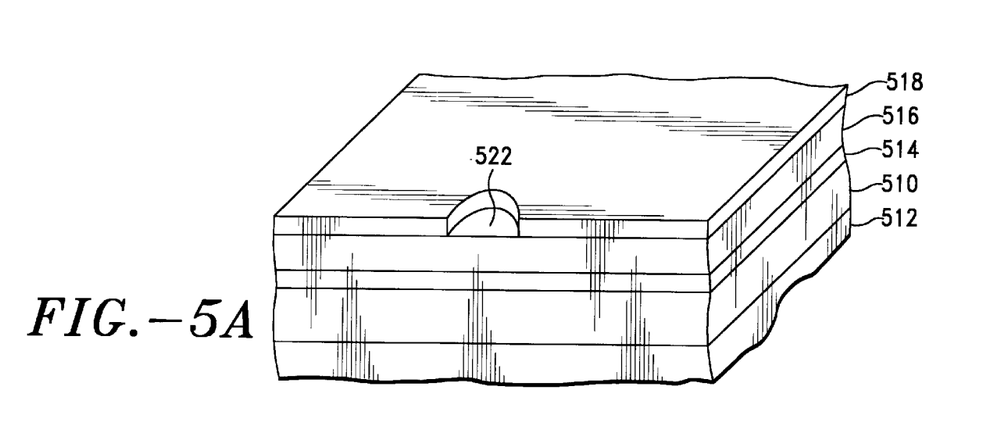
FIGS. 5A–5D are schematic cross-sectional perspective views illustrating another embodiment of IC structures of the present invention at sequential stages.
Figure 5B:
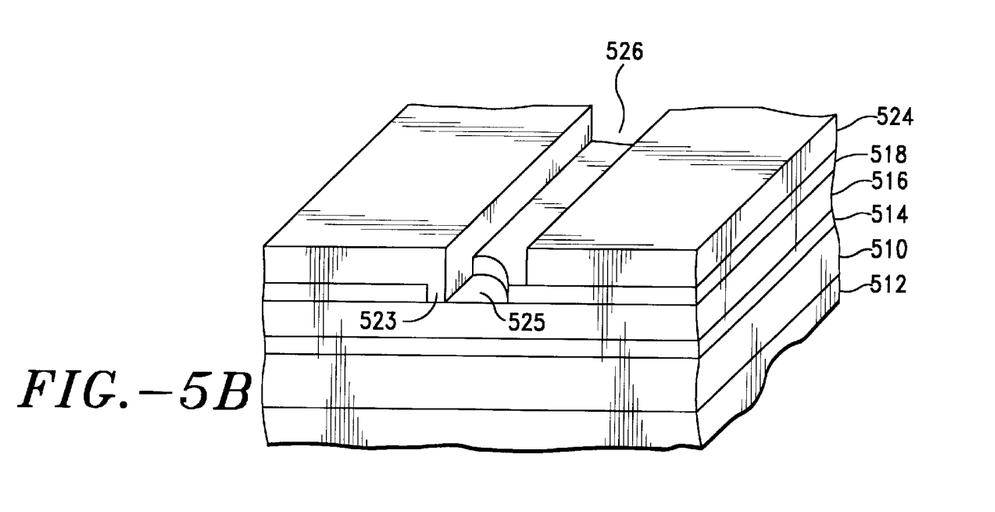
Figure 5C:
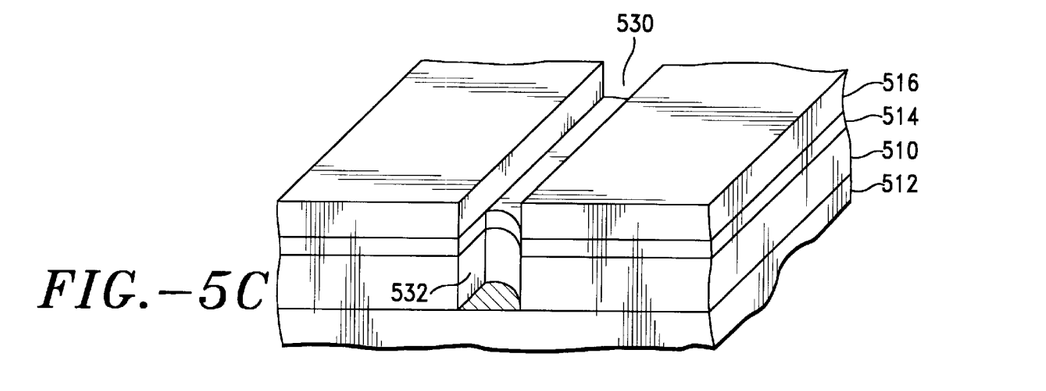
Figure 5D:
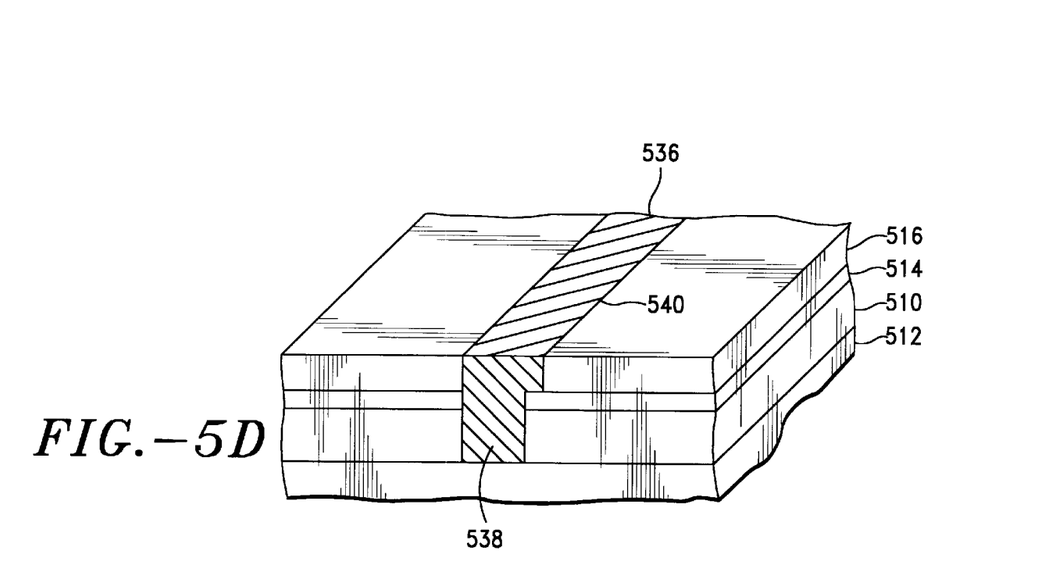

An additional embodiment of the present invention is illustrated in the IC structures shown in FIGS. 5A–5D, wherein a single layer of silicon-based photoresist is used instead of a combination of photoresist and hard mask. FIG. 5A shows a first dielectric layer 510 which is deposited on a semiconductor substrate 512. Etch stop layer 514 is deposited on first dielectric layer 510. Second dielectric layer 516 is deposited on the etch stop layer. Layers 510, 512, 514 and 516 are similar to layers 310, 312, 314 and 316 respectively, depicted in FIG. 3A. A layer of silicon-based, photosensitive mask material 518 (FIG. 5A) is deposited on second dielectric layer 516, using for example CVD PPMS. The PPMS layer is patterned for a via by selective exposure to UV light forming PPMSO in the exposed portion. Unexposed PPMS is removed by etching, resulting in via pattern 522. Photoresist layer 524 is deposited on the structure and trench pattern 526 (FIG. 5B) is developed in the photoresist layer such that the trench pattern is positioned over the underlying via pattern, similar to photoresist 324 shown in FIG. 3B. FIG. 5B illustrates an example of misalignment between via pattern 522 and trench pattern 526. It is noted that portion 523 of photoresist 524 is deposited partly inside the via pattern as a result of the misalignment. This causes the width of the via pattern to be reduced to pattern 525. The dual damascene fabrication process is continued in a manner similar to the inventive techniques described in connection with FIGS. 3C–3G resulting in the IC structures illustrated in FIGS. 5C and 5D. FIG. 5C shows trench 530 and via hole 532 which has a reduced width due to the misalignment between the trench pattern and the via pattern. A dual damascene structure is fabricated by simultaneously filling trench 530 and via hole 532 with a suitable conductive material 536 (FIG. 5D), forming a via plug 538 and interconnect line 540.

The embodiments of the current invention depicted in FIGS. 2A–5D have the advantage of a larger processing window than prior art dual damascene techniques. The larger processing window is due to a reduced etching degradation of the etch stop and the resist because the trench and the via hole are formed simultaneously. It is due also to the elimination of prior art fabricating problems which are caused by the need to remove resist from the via hole. The novel techniques of the present invention thus result in misalignment tolerant dual damascene process techniques and structures.

The various etching procedures utilized in the present invention require selectively etching certain layers. For example, the etch chemistry used in etching the hard mask and the etch stop layer needs to be selective to the dielectric layers. Similarly, it is necessary that the chemistry used for etching the dielectric layers is selective to the hard mask and etch stop layers. The layers of the inventive structures can be etched by any of the methods and etch chemistries which are well known to those of ordinary skill in the art. Suitable etch chemistries for etching oxides, such as $SiO_2$, include $C_4F_8$ which is selective with respect to nitride and low dielectric constant materials. Low dielectric constant materials, such as fluorinated carbon compounds, poly (arylene) ether and naphthalene based compounds are effectively etched in $O_2/N_2$ etch chemistry which is selective with respect to $SiO_2$ and nitride. Nitride etch chemistries include $CH_2F_2/CO/O_2$.

It will be understood that it is necessary to clean or prepare the surface of the structure prior to the deposition of any layer in any subsequent fabrication step, using surface preparation methods and materials which are well known to those of ordinary skill in the art.

The novel dual damascene fabrication techniques of the present invention require a sequence of processing steps.

Figure 6:
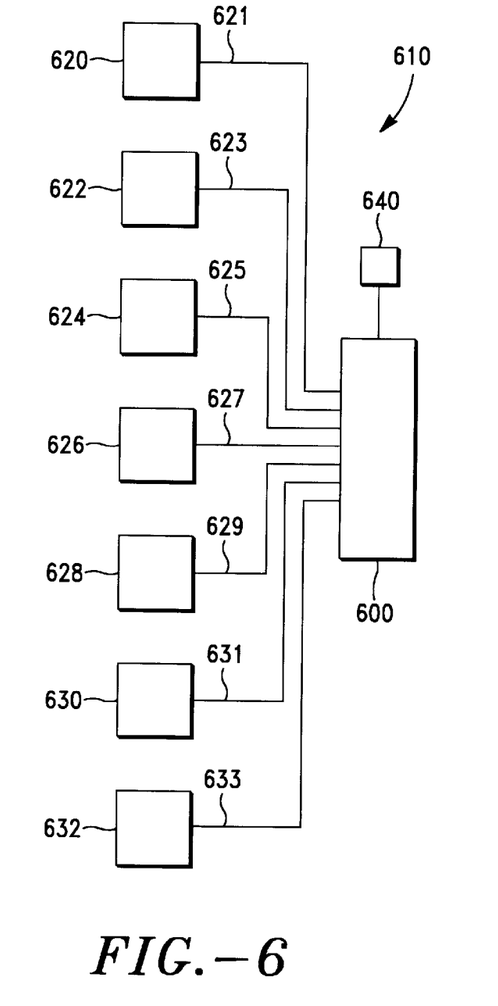
FIG. 6 is a block diagram illustrating a manufacturing system for fabricating the IC structures of FIGS. 2A–2I.

Each processing step can be performed at a fabrication station. All or some of the fabrication stations and their respective processing steps can be integrated by means of a novel apparatus including a controller 600 illustrated in FIG. 6. Controller 600 is adapted for controlling a number of fabrication stations which are utilized in the formation of IC structures described in connection with FIGS. 2A–2I. As illustrated in FIG. 6, a novel manufacturing system 610 for fabricating IC structures includes controller 600 and a plurality of fabrication stations: 620, 622, 624, 626, 628, 630 and 632. Additionally, system 610 has operative links 621, 623, 625, 627, 629, 631 and 633 which provide connections between controller 600 and fabrication stations 620, 622, 624, 626, 628, 630 and 632 respectively. The apparatus includes a data structure such as a computer program which causes controller 600 to control the processing steps at each of the fabrication stations and to, optionally, regulate the sequence in which fabrication stations are used in order to form the novel IC structures.

Examples of suitable controllers include conventional computers and computer systems including one or more computers which are operably connected to other computers or to a network of computers or data processing devices. Suitable computers include, but are not limited to, computers commonly known as personal computers. The data structure which is used by controller 600 can be stored on a removable electronic data storage medium 640 (FIG. 6), such as computer floppy disks, removable computer hard disks, magnetic tapes and optical disks, to facilitate the use of the same data structure at different manufacturing locations. Alternatively, the data structure can be stored on a non-removable electronic data storage medium, including a medium positioned at a location which is remote (not shown) from controller 600, using such data storage devices as are well known to those of ordinary skill in the art. The data structure can be communicated from a remote location to controller 600 using communicating techniques which are well known to those of ordinary skill in the art including hard wire connections, wireless connections and data communication methods utilizing one or more modems or techniques using one or more computers commonly known as servers. The data storage medium can be operably connected to the controller using methods and device components which are well known to those of ordinary skill in the art. Examples of suitable fabrication stations for manufacturing system 610 include the stations shown in Table A.

TABLE A

| Station | Processing Step |
| --- | --- |
| 620 | depositing a first dielectric layer on a substrate |
| 622 | depositing an etch stop layer on the first dielectric layer |
| 624 | depositing a second dielectric layer on the etch stop layer |
| 626 | forming a hard mask layer having a trench pattern on the second dielectric layer |
| 628 | depositing a photoresist on the hard mask layer |
| 630 | forming a via pattern in the photoresist |
| 632 | anisotropically etching the via pattern through the hard mask layer |

Additional fabrication stations can be added to manufacturing system 610. It is also contemplated that one or more fabrication stations can be positioned at a location which is remote (not shown) from the other fabrication stations in which case an additional controller or a network of controllers can be employed to control the remotely located manufacturing station.

As illustrated in FIG. 6, controller 600 is adapted to be connected to each of the manufacturing stations through operative links. Each of these links provides a bidirectional connection enabling controller 600 to transfer commands from its data structure, such as specific operating parameters, and to receive information, such as test data, from the fabrication station. The operative links can be in the form of hard wire connections or wireless connections.

Figure 7:
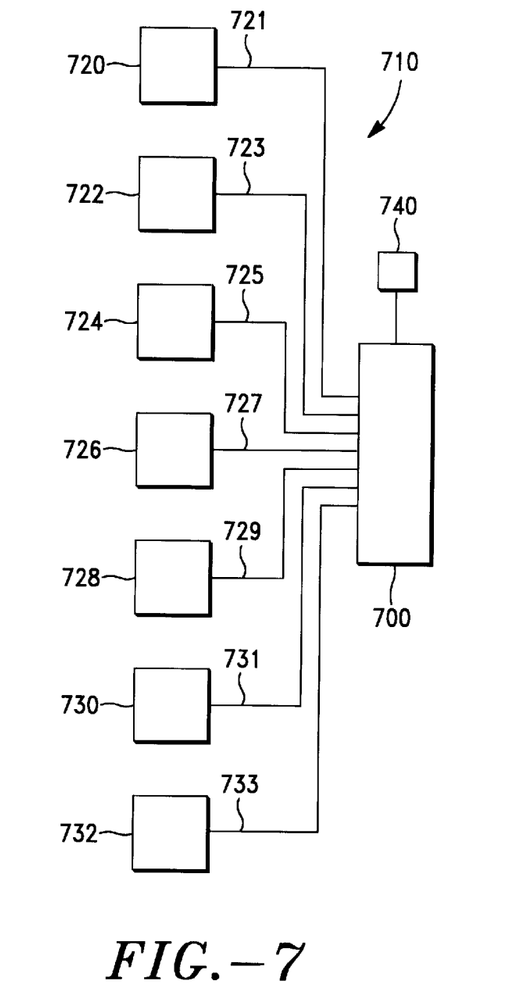
FIG. 7 is a block diagram illustrating a manufacturing system for fabricating the IC structures of FIGS. 3A–3G.

FIG. 7 depicts another embodiment of the present invention. A novel apparatus including inventive controller 700 is adapted for controlling fabrication stations which are utilized in the formation of fabricated structures, such as IC structures described in connection with FIGS. 3A–3G. Fabrication stations 720, 722, 724, 726, 728, 730 and 732 are connected to controller 700 through operative links 721, 723, 725, 727, 729, 731 and 733 respectively. The novel apparatus includes a data structure which causes the controller to control the processing steps at each of the fabrication stations. A novel manufacturing system 710 for manufacturing IC structure of FIGS. 3A–3G includes controller 700 and, the data structure, the above manufacturing stations and the operative links. The data structure can be provided on a removable electronic storage medium 740, or on a non-removable data storage medium. The controller, the data structure, the operative links and the storage medium are similar to those described in connection with FIG. 6. Examples of suitable fabrication stations for manufacturing system 710 include the stations shown in Table B.

TABLE B

| Station | Processing Step |
| --- | --- |
| 720 | depositing a first dielectric layer on a substrate |
| 722 | depositing an etch stop layer on the first dielectric layer |
| 724 | depositing a second dielectric layer on the etch stop layer |
| 726 | forming a hard mask layer having a via pattern on the second dielectric layer |
| 728 | depositing a photoresist on the hard mask layer |
| 730 | forming a trench pattern in the photoresist |
| 732 | anisotropically etching the via pattern through the second dielectric layer |

Suitable semiconductor materials for use in semiconductor substrates of the present invention include silicon, germanium, silicon/germanium alloys, gallium arsenide, and indium/gallium/arsenide/phosphide. Typically, dual damascene structures of the present invention contact a metallized line of the semiconductor substrate. Suitable conductive materials for filling the dual damascene trenches and via holes of the present invention include metals such as Cu, Ag, Al, W, their alloys and mixtures of these metals with or without alloys. Suitable conductive materials also include metallic and nonmetallic superconductors, i.e. materials having zero direct current resistance at or below their superconducting transition temperature, such as metallic nickel/germanium and yttrium/barium/copper oxides. Suitable techniques for simultaneously filling dual damascene trenches and via holes include CVD, PVD, electroplating and electroless plating.

The invention has been described in terms of the preferred embodiment. One skilled in the art will recognize that it would be possible to construct the elements of the present invention from a variety of means and to modify the placement of components in a variety of ways. While the embodiments of the invention have been described in detail and shown in the accompanying drawings, it will be evident that various further modifications are possible without departing from the scope of the invention as set forth in the following claims.

I claim:

1. A method of forming a structure on a substrate, the method comprising:

a) depositing a first dielectric layer on the substrate;

b) depositing an etch stop layer on the first dielectric layer;

c) depositing a second dielectric layer on the etch stop layer, such that the first and second dielectric layers comprise materials have similar etching characteristics;

d) forming a hard mask layer having a trench pattern on the second dielectric layer;

e) depositing a first photoresist on the hard mask layer;

f) forming a via pattern over the underlying trench pattern in the first photoresist; and g) anisotropically etching the via pattern through the hard mask layer in a first etching procedure.

2. The method of claim 1 additionally comprising:

a) anisotropically etching the via pattern through the second dielectric layer in a second etching procedure;

b) anisotropically etching the via pattern through the etch stop layer in a third etching procedure;

c) anisotropically etching the trench pattern through the second dielectric layer and simultaneously anisotropically etching the via pattern through the first dielectric layer in a fourth etching procedure;

d) removing the first photoresist; and e) anisotropically etching the trench pattern through the etch stop layer and simultaneously etching the hard mask layer to remove the hard mask layer from the second dielectric layer, in a fifth etching procedure, whereby a trench and a via hole are formed which are adapted for fabricating a dual damascene structure.

3. The method of claim 1 wherein forming a hard mask layer comprises:

a) depositing a hard mask material on the second dielectric layer;

b) depositing a second photoresist having the trench pattern on the hard mask layer;

c) transferring the trench pattern to the hard mask layer; and d) removing the second photoresist.

4. The method of claim 1 wherein forming a hard mask layer comprises:

a) depositing a layer of silicon-based photosensitive material on the second dielectric layer;

b) patterning the layer of silicon-based photosensitive material to define the trench pattern; and c) developing the silicon-based material to form a hard mask including the trench pattern.

5. The method of claim 4 wherein the silicon-based photosensitive material is plasma polymerized methylsilane which is patterned by exposure to radiation such that exposure causes the plasma polymerized methylsilane to form a hard mask comprising plasma polymerized methylsilane oxide.

6. The method of claim 1 wherein the first etching procedure comprises a first etch chemistry which is selective with respect to the second dielectric layer.

7. The method of claim 6 wherein the third etching procedure comprises a second etch chemistry which is selective with respect to the first dielectric layer.

8. The method of claim 7 wherein the fourth etching procedure comprises a third etch chemistry which is selective with respect to the etch stop layer.

9. The method of claim 8 wherein the fifth etching procedure comprises a fourth etch chemistry which is selective with respect to the first and second dielectric layers.

10. The method of claim 1 wherein the first and second dielectric layers comprise oxide dielectric materials.

11. The method of claim 10 wherein the etch stop and hard mask layers comprise one or more nitrides.

12. The method of claim 1 wherein the first and second dielectric layers comprise one or more materials selected from the group consisting of dielectric materials having a dielectric constant which is <3.5.

13. The method of claim 12 wherein the etch stop and hard mask layers comprise an oxide.

14. The method of claim 1 wherein the trench has a misalignment compensating portion which is contiguous with the trench and the via hole.

15. The method of claim 2 additionally comprising: simultaneously filling the trench and the via hole with a conductive material, whereby a dual damascene structure is formed.

16. The method of claim 15 wherein the dual damascene structure comprises an interconnect line and a via plug, wherein the line has a misalignment compensating segment which is contiguous with the line and the via plug.

17. The method of claim 15 wherein the conductive material comprises one or more materials selected from the group consisting of metals, alloys, metallic superconductors and nonmetallic superconductors.

18. The method of claim 15 wherein the conductive material comprises one or more materials selected from the group consisting of Cu, Ag, Al, W, Cu alloys, Ag alloys, Al alloys, W alloys, nickel/germanium and yttrium/barium/copper oxides.

19. The method of claim 15 wherein filling the trench and the via hole comprises methods selected from the group consisting of chemical vapor deposition, physical vapor deposition, electroplating and electroless plating.

20. The method of claim 15 additionally comprising depositing a liner material inside the via hole and the trench, prior to filling the via hole and the trench with conductive material.

21. A method of forming a structure on a substrate, the method comprising:

a) depositing a first dielectric layer on the substrate;

b) depositing an etch stop layer on the first dielectric layer;

c) depositing a second dielectric layer comprising a material having a dielectric constant <3.5 on the etch stop layer, wherein the first and second dielectric layers comprise materials having similar etching characteristics;

d) depositing an oxide hard mask layer on the second dielectric layer; such that the oxide hard mask layer and the etch stop layer comprise materials having similar etching characteristics;

e) depositing a nitride hard mask layer on the oxide hard mask layer;

f) depositing a first photoresist having a trench pattern on the nitride hard mask layer;

g) transferring the trench pattern to the nitride hard mask layer;

h) removing the first photoresist;

i) transferring the trench pattern to the oxide hard mask layer;

j) removing the nitride hard mask layer;

k) depositing a second photoresist on the oxide hard mask layer;

l) forming a via pattern over the underlying trench pattern in the second photoresist; and m) anisotropically etching the via pattern through the hard mask layer.

22. The method of claim 21 additionally comprising:

a) anisotropically etching the via pattern through the second dielectric layer;

b) anisotropically etching the via pattern through the etch stop layer;

c) removing the second photoresist;

d) anisotropically etching the trench pattern through the second dielectric layer and simultaneously anisotropically etching the via pattern through the first dielectric layer; and e) anisotropically etching the trench pattern through the etch stop layer and simultaneously etching the oxide hard mask layer to remove the hard mask layer from the second dielectric layer, whereby a trench and a via hole are formed which are adapted for fabricating a dual damascene structure.

23. The method of claim 22 wherein the trench has a misalignment compensating portion which is contiguous with the trench and the via hole.

24. The method of claim 22 additionally comprising: simultaneously filling the trench and the via hole with a conductive material, whereby a dual damascene structure is formed.

25. A method of forming a structure on a substrate, the method comprising:

a) depositing a first dielectric layer on the substrate;

b) depositing an etch stop layer on the first dielectric layer;

c) depositing a second dielectric layer on the etch stop layer, wherein the first and second dielectric layers comprise materials having similar etching characteristics;

d) forming a hard mask layer having a via pattern on the second dielectric layer;

e) depositing a first photoresist on the hard mask layer;

f) forming a trench pattern over the underlying via pattern in the first photoresist; and g) anisotropically etching the via pattern through the second dielectric layer in a first etching procedure.

26. The method of claim 25 additionally comprising:

a) anisotropically etching the trench pattern through the hard mask layer and simultaneously anisotropically etching the via pattern through the etch stop layer in a second etching procedure;

b) anisotropically etching the trench pattern through the second dielectric layer and simultaneously anisotropically etching the via pattern through the first dielectric layer in a third etching procedure;

c) removing the first photoresist; and d) removing the hard mask layer, whereby a trench and a via hole are formed which are adapted for fabricating a dual damascene structure.

27. The method of claim 25 wherein forming a hard mask layer comprises:

a) depositing a hard mask layer on the second dielectric layer;

b) depositing a second photoresist having the via pattern on the hard mask layer;

c) transferring the via pattern to the hard mask layer; and d) removing the second photoresist.

28. The method of claim 25 wherein forming a hard mask layer comprises:

a) depositing a layer of silicon-based photosensitive material on the second dielectric layer;

b) patterning the layer of silicon-based photosensitive material to define the via pattern; and c) developing the silicon-based material to form a hard mask including the via pattern.

29. The method of claim 28 wherein the silicon-based photosensitive material is plasma polymerized methylsilane which is patterned by exposure to radiation such that exposure causes the plasma polymerized methylsilane to form a hard mask comprising plasma polymerized methylsilane oxide.

30. The method of claim 25 wherein the first etching procedure comprises a first etch chemistry which is selective with respect to the hard mask layer.

31. The method of claim 30 wherein the second etching procedure comprises a second etch chemistry which is selective with respect to the second dielectric layer.

32. The method of claim 31 wherein the third etching procedure comprises a third etch chemistry which is selective with respect to the etch stop layer.

33. The method of claim 25 wherein the first and second dielectric layers comprise oxide dielectric materials.

34. The method of claim 30 wherein the etch stop and hard mask layers comprise one or more nitrides.

35. The method of claim 25 wherein the first and second dielectric layers comprise one or more materials selected from the group consisting of dielectric materials having a dielectric constant which is <3.5.

36. The method of claim 35 wherein the etch stop and hard mask layers comprise an oxide.

37. The method of claim 25 additionally comprising: simultaneously filling the trench and the via hole with a conductive material, whereby a dual damascene structure is formed.

38. The method of claim 37 wherein the conductive material comprises one or more materials selected from the group consisting of metals, alloys, metallic superconductors and nonmetallic superconductors.

39. The method of claim 37 wherein the conductive material comprises one or more materials selected from the group consisting of Cu, Ag, Al, W, Cu alloys, Ag alloys, Al alloys, W alloys, nickel/germanium and yttrium/barium/copper oxides.

40. The method of claim 37 additionally comprising depositing a liner material inside the via hole and the trench, prior to filling the via hole and the trench with conductive material.

* * * * *